United States Patent
Yu et al.

(10) Patent No.: US 12,127,439 B2
(45) Date of Patent: Oct. 22, 2024

(54) DISPLAY SUBSTRATE AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zhaowei Yu, Beijing (CN); Qinhe Wei, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 429 days.

(21) Appl. No.: 17/602,780

(22) PCT Filed: Dec. 23, 2020

(86) PCT No.: PCT/CN2020/138504
§ 371 (c)(1),
(2) Date: Oct. 11, 2021

(87) PCT Pub. No.: WO2022/133769
PCT Pub. Date: Jun. 30, 2022

(65) Prior Publication Data
US 2022/0399412 A1    Dec. 15, 2022

(51) Int. Cl.
*H10K 59/122* (2023.01)
*H10K 50/80* (2023.01)
(Continued)

(52) U.S. Cl.
CPC ......... *H10K 59/122* (2023.02); *H10K 50/844* (2023.02); *H10K 50/868* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | |
|---|---|---|
| 2018/0102509 A1 | 4/2018 | Kim |
| 2019/0208044 A1 | 7/2019 | Lee et al. |
| (Continued) | | |

FOREIGN PATENT DOCUMENTS

| | | |
|---|---|---|
| CN | 107919437 A | 4/2018 |
| CN | 110350001 A | 10/2019 |
| (Continued) | | |

*Primary Examiner* — Michael Lebentritt
(74) *Attorney, Agent, or Firm* — Ling Wu; Stephen Yang; Ling and Yang Intellectual Property

(57) ABSTRACT

Provided are a display substrate, a preparation method thereof, and a display apparatus. The display substrate includes a display region, a first transition region located in the display region, a second transition region located in the first transition region, and a vacant region located in the second transition region, wherein the first transition region includes a substrate, a buffer layer disposed on the substrate, an insulating layer disposed on the buffer layer, and a plurality of dam spacers disposed on the insulating layer; and the second transition region includes a substrate, a buffer layer disposed on the substrate, and a plurality of post spacers disposed on the buffer layer, and the plurality of dam spacers and the plurality of post spacers are all disposed around the vacant region.

14 Claims, 5 Drawing Sheets

(51) Int. Cl.
*H10K 50/844* (2023.01)
*H10K 71/00* (2023.01)
*H10K 59/12* (2023.01)

(56) References Cited

U.S. PATENT DOCUMENTS

| | | | |
|---|---|---|---|
| 2020/0050047 A1 | 2/2020 | Son et al. | |
| 2020/0127231 A1 | 4/2020 | Yun et al. | |
| 2020/0136087 A1 | 4/2020 | Kim et al. | |
| 2020/0144542 A1 | 5/2020 | Kim et al. | |
| 2021/0305335 A1 | 9/2021 | Gao et al. | |
| 2021/0408457 A1 | 12/2021 | Fang et al. | |
| 2022/0302226 A1* | 9/2022 | Shin | A61B 5/6898 |
| 2022/0309973 A1* | 9/2022 | Won | G09G 3/035 |
| 2023/0134423 A1* | 5/2023 | Lee | H10K 59/352 |
| | | | 257/40 |

FOREIGN PATENT DOCUMENTS

| | | | | |
|---|---|---|---|---|
| CN | 111081732 A | | 4/2020 | |
| CN | 111106146 A | | 5/2020 | |
| CN | 111430566 A | | 7/2020 | |
| CN | 111816664 A | | 10/2020 | |
| CN | 211929490 U | | 11/2020 | |
| CN | 116364721 A | * | 6/2023 | ......... H01L 27/1225 |
| CN | 116709846 A | * | 9/2023 | ......... H01L 27/3276 |
| CN | 116744591 A | * | 9/2023 | ......... H10K 59/1201 |
| EP | 3306697 A1 | * | 4/2018 | ............ H01L 22/12 |
| WO | WO-2022001405 A1 | * | 1/2022 | |
| WO | WO-2022227005 A1 | * | 11/2022 | ......... H10K 59/1201 |
| WO | WO-2023185884 A1 | * | 10/2023 | |

* cited by examiner

DISPLAY SUBSTRATE AND PREPARATION METHOD THEREOF, AND DISPLAY APPARATUS

TECHNICAL FIELD

The present disclosure relates to, but is not limited to, the field of display technologies, in particular to a display substrate and a preparation method thereof, and a display apparatus.

BACKGROUND

An organic light-emitting diode (OLED) is an active light-emitting display device, and has advantages of self-emission, wide view angle, high contrast, low power consumption, and extremely high response speed, etc. With continuous development of display technologies, OLED technologies are increasingly applied to various display apparatuses, particularly to smart terminal products such as mobile phones and tablet computers.

For smart terminal products, most manufacturers are pursuing a higher screen-to-body ratio, such as a full screen and a bezel-less screen, so as to bring more dazzling visual impact to users. As hardware such as a front camera and a light sensor are usually required for products such as smart terminals, a solution of providing mounting holes in an Active Area region of an OLED display screen to set up a camera and other hardware is attracting great attention in the industry.

SUMMARY

The following is a summary of subject matter described in detail herein. This summary is not intended to limit the protection scope of claims.

An exemplary embodiment of the present disclosure provides a display substrate, including: a display region, a first transition region located in the display region, a second transition region located in the first transition region, and a vacant region located in the second transition region, wherein the first transition region includes a substrate, a buffer layer disposed on the substrate, an insulating layer disposed on the buffer layer and a plurality of dam spacers disposed on the insulating layer; the second transition region includes a substrate, a buffer layer disposed on the substrate, and a plurality of post spacers disposed on the buffer layer; the plurality of dam spacers and the plurality of post spacers are all disposed around the vacant region.

In an exemplary embodiment, the display region includes a substrate, a driving structure layer disposed on the substrate, a planarization layer disposed on the driving structure layer, and a pixel define layer defining a pixel opening region; the driving structure layer includes a buffer layer located on the substrate, an active layer located on the buffer layer, a first insulating layer covering the active layer, a first gate electrode layer located on the first insulating layer, a second insulating layer covering the first gate electrode layer, a second gate electrode layer located on the second insulating layer, a third insulating layer covering the second gate electrode layer, and a first source-drain electrode layer located on the third insulating layer; and the insulating layer includes a first insulating layer located on the buffer layer, a second insulating layer located on the first insulating layer, and a third insulating layer located on the second insulating layer.

In an exemplary embodiment, the plurality of dam spacers include a plurality of first dam spacers and a plurality of second dam spacers; a first dam spacer includes a first dam foundation and a first protrusion, and a second dam spacer includes a second protrusion; a closest distance between the first dam spacer and the vacant region is greater than a closest distance between the second dam spacer and the vacant region, wherein the first dam foundation is disposed in a same layer as the planarization layer, and the first protrusion and the second protrusion are disposed in a same layer as the pixel define layer.

In an exemplary embodiment, in a plane perpendicular to the substrate, a height, from the substrate, of an end of the first dam spacer away from the substrate is greater than or equal to a height, from the substrate, of an end of the second dam spacer away from the substrate.

In an exemplary embodiment, in a plane perpendicular to the substrate, a distance between an end of the second dam spacer close to the substrate and an end of a post spacer close to the substrate is 5 to 40 microns, and a distance between an end of the first dam spacer close to the substrate and the end of the second dam spacer close to the substrate is 10 to 40 microns.

In an exemplary embodiment, a post spacer includes a second dam foundation and a third protrusion, wherein the second dam foundation and the planarization layer are disposed in a same layer, and the third protrusion and the pixel define layer are disposed in a same layer.

In an exemplary embodiment, in a plane perpendicular to the substrate, a height, from the substrate, of an end of a dam spacer away from the substrate is greater than or equal to a height, from the substrate, of an end of the post spacer away from the substrate.

In an exemplary embodiment, in a plane perpendicular to the substrate, a width of an end of a post spacer away from the substrate is smaller than a width of an end of the post spacer close to the substrate.

In an exemplary embodiment, a closest distance between the end of the post spacer away from the substrate and the vacant region is 10 to 20 microns; a closest distance between the end of the post spacer close to the substrate and the vacant region is 1 to 5 microns.

In an exemplary embodiment, in a plane perpendicular to the substrate, a width of an end of a dam spacer away from the substrate is smaller than a width of an end of the dam spacer close to the substrate.

In an exemplary embodiment, the display region further includes a light-emitting structure layer disposed on the planarization layer and an encapsulation layer disposed on the light-emitting structure layer, wherein the encapsulation layer includes a first inorganic layer, a second inorganic layer, and an organic encapsulation layer disposed between the first inorganic layer and the second inorganic layer, and both the first inorganic layer and the second inorganic layer extend to the first transition region and the second transition region, and cover the plurality of dam spacers and the plurality of post spacers.

In an exemplary embodiment, the display substrate further includes a polarizer located on the encapsulation layer, wherein an orthographic projection of a contact region between the second inorganic layer and the polarizer in the second transition region on the substrate is within a range of an orthographic projection of a post spacer on the substrate; in a plane parallel to the substrate, an area of a contact region between the second inorganic layer and the polarizer in the second transition region is greater than or equal to an area of an end of the post spacer away from the substrate.

An exemplary embodiment of the present disclosure further provides a display apparatus which includes the aforementioned display substrate, wherein the vacant region is used for installing a hardware structure.

The present disclosure further provides a preparation method for a display substrate including a display region, a first transition region located in the display region, a second transition region located in the first transition region, and a vacant region located in the second transition region; the preparation method includes: forming a buffer layer covering a substrate; forming insulating layers covering the buffer layer in the first transition region, the second transition region, and the vacant region, and patterning the insulating layer of the second transition region and the insulating layer of the vacant region through a patterning process to form a first groove exposing the buffer layer, wherein an orthographic projection of the first groove on the substrate covers orthographic projections of the second transition region and the vacant region on the substrate; and forming a plurality of dam spacers on the insulating layers, and forming a plurality of post spacers in the first groove, wherein the plurality of dam spacers and the plurality of post spacers are disposed around the vacant region.

In an exemplary embodiment, the dam spacers and the post spacers are disposed on a same layer, made of a same material, and formed by a same process; or, the dam spacers and the post spacers are not disposed in a same layer.

In an exemplary embodiment, the preparation method further includes: forming a driving structure layer disposed on the substrate, a planarization layer disposed on the driving structure layer, and a pixel define layer defining a pixel opening region in the display region; the driving structure layer includes a buffer layer located on the substrate, an active layer located on the buffer layer, a first insulating layer covering the active layer, a first gate electrode layer located on the first insulating layer, a second insulating layer covering the first gate electrode layer, a second gate electrode layer located on the second insulating layer, a third insulating layer covering the second gate electrode layer, and a first source-drain electrode layer located on the third insulating layer; and the insulating layers includes a first insulating layer located on the buffer layer, a second insulating layer located on the first insulating layer, and a third insulating layer located on the second insulating layer.

In an exemplary embodiment, the plurality of dam spacers include a plurality of first dam spacers and a plurality of second dam spacers; a first dam spacer includes a first dam foundation and a first protrusion, and a second dam spacer includes a second protrusion; a closest distance between the first dam spacer and the vacant region is greater than a closest distance between the second dam spacer and the vacant region; and the first dam foundation is disposed in a same layer as the planarization layer, and the first protrusion and the second protrusion are disposed in a same layer as the pixel define layer.

In an exemplary embodiment, a post spacer includes a second dam foundation and a third protrusion, wherein the second dam foundation and the planarization layer are disposed in a same layer, and the third protrusion and the pixel define layer are disposed in a same layer.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the description to explain the technical solutions of the present disclosure together with embodiments of the present disclosure, and do not constitute any limitation on the technical solutions of the present disclosure. Shapes and sizes of various components in the drawings do not reflect true scales and are intended to illustrate schematically contents of the present disclosure only.

DETAILED DESCRIPTION

Figure 1:
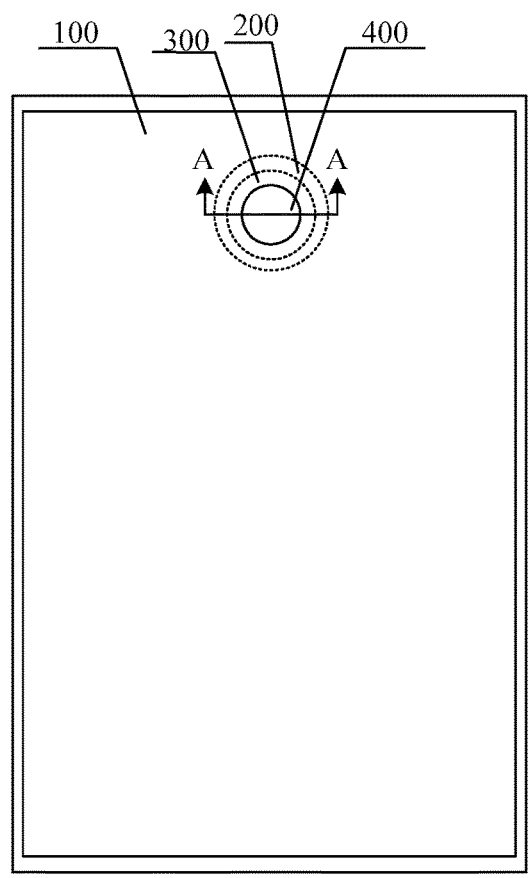
FIG. 1 is a schematic diagram of a structure of a display substrate of an exemplary embodiment of the present disclosure.

To make objects, technical solutions, and advantages of the present disclosure more clear, embodiments of the present disclosure will be described in detail below with reference to the drawings. It should be noted that the embodiments may be implemented in many different forms. Those of ordinary skills in the art may readily understand a fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements, thicknesses or regions of layers are sometimes exaggerated for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers such as "first", "second", "third" and the like in this description are used to avoid confusion between constituent elements, rather than to constitute limitations on quantities.

In this description, for sake of convenience, wordings "central", "upper", "lower", "front", "rear", "vertical", "horizontal", "top", "bottom", "inner", "outer" and the like which are used to indicate orientations or positional relations, to describe the positional relations between constituent elements with reference to the drawings, are only for a purpose of facilitating description of this description and simplifying the description, rather than indicating or implying that an apparatus or element referred to must have a specific orientation, or must be constructed and operated in a particular orientation, and therefore cannot be construed as limitations on the present disclosure. The positional relations between the constituent elements are appropriately changed according to directions in which various constituent elements are described. Therefore, the wordings are not limited in the description, and may be replaced appropriately according to situations.

In this description, terms "install", "connect", and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, specific meanings of the above terms in the present disclosure may be understood according to specific situations.

In this description, a transistor refers to an element including at least three terminals, namely a gate electrode, a drain electrode, and a source electrode. The transistor has a channel region between the drain electrode (a drain electrode terminal, a drain region, or a drain electrode) and the source electrode (a source electrode terminal, a source region, or a source electrode), and current can flow through the drain electrode, the channel region, and the source electrode. It should be noted that in this description, the channel region refers to a region through which current mainly flows.

In this description, the first electrode may be a drain electrode and the second electrode may be a source electrode, or the first electrode may be a source electrode and the second electrode may be a drain electrode. Functions of the "source electrode" and that of the "drain electrode" are sometimes interchangeable in a case where transistors with opposite polarities are used or in a case where a direction of current changes during circuit operation. Therefore, in this description, "source electrode" and "drain electrode" are interchangeable.

In this description, an "electrical connection" includes a case where constituent elements are connected together through an element with an electric action. The "element with an electric action" is not particularly limited as long as it can transmit and receive electrical signals between the connected constituent elements. Examples of the "element with an electric action" include not only electrodes and wirings, but also switching elements such as transistors, resistors, inductors, capacitors, and other elements having various functions.

In this description, "parallel" refers to a case where an angle formed by two straight lines is above −10 degrees and below 10 degrees, and thus also includes a case where the angle is above −5 degrees and below 5 degrees. In addition, "perpendicular" refers to a case where an angle formed by two straight lines is above −80 degrees and below 100 degrees, and thus also includes a case where the angle is above −85 degrees and below 95 degrees.

In this description, "film" and "layer" may be interchangeable. For example, sometimes "conductive layer" may be replaced by "conductive film". Similarly, "insulating film" may sometimes be replaced by "insulating layer".

An OLED display device is a self-luminous display device. Compared with conventional liquid crystal display, the OLED display device has obvious advantages such as high brightness, high contrast, high saturation color, and high response rate, thus has gradually become a mainstream product in the display field. In actual practical application processes, some terminal manufacturers have begun to provide mounting holes for reserving installation positions of hardware such as front cameras in an Active Area (AA) region of a display panel, in order to pursue a larger area of the Active Area region and reduce bezels.

Generally, a flexible display product is easily affected by an external light when used in a natural environment, which affects adversely normal use, and a polarizer thus is usually needed to be attached to a surface of the flexible display product to prevent an influence of a natural light on a display device. At the same time, the polarizer can also achieve an integrated black effect of the display device.

A main component of a polarizer is polyvinyl acetate to absorb a dyeing substance (an iodine compound). Before the polarizer is attached to a display device, upper and lower layers of the polarizer are provided with protective films for preventing the polarizer from being damaged during transportation and affecting adversely its use. Therefore, the protective films needed be removed first before attaching the polarizer to the display device. After attaching the polarizer, a laser is used to cut a region of a mounting hole (an AA hole) into a through hole, the upper protective film of the polarizer is peeled off, and a subsequent cover plate attachment is performed.

Laser cutting is to irradiate a workpiece with a focused high-power density laser beam, so that the irradiated material is quickly melt, vaporize, ablate, or reach an ignition point. At the same time, the molten material is blown away by a high-speed airflow coaxial with the beam, so that the workpiece can be cut open. However, since a display substrate is formed by stacking a plurality of layers of materials with different thermal expansion coefficients, upper and lower layers in a region of an AA hole may have different degrees of splits under an action of heat. In addition, an existing structural design causes a large cutting angle of an inorganic encapsulation layer at an edge of an AA hole, which is prone to stress concentration, and the edge of the AA hole is not easily wetted by ink. Due to adhesion of a film in a subsequent film peeling process, splitting degrees of the AA hole will be further increased, destroying an encapsulation structure of the region of the AA hole and resulting in a Growing Black Spots (GDS) phenomenon on a display screen, which seriously affects adversely a product yield and display quality.

Embodiments of the present disclosure provide a display substrate, a preparation method thereof, and a display apparatus. Without changing existing process flows, by providing a plurality of post spacers around a vacant region, a stacked structure of the vacant region shrinks inward before cutting, thereby avoiding an interlayer splitting phenomenon caused by thermal expansion of film layers caused by heat conduction of a cutting edge, and solving a problem of cracking of an edge structure caused by adhesion stress in a subsequent film peeling process. On the other hand, a contact area between an inorganic encapsulation layer and a polarizer is increased, an angle formed by edge cutting of the AA hole is reduced, and stress concentration of a cutting edge of the AA hole is reduced, thereby avoiding a GDS problem caused by the cracking of the edge structure caused by adhesion stress in the subsequent film peeling process.

Figure 2:
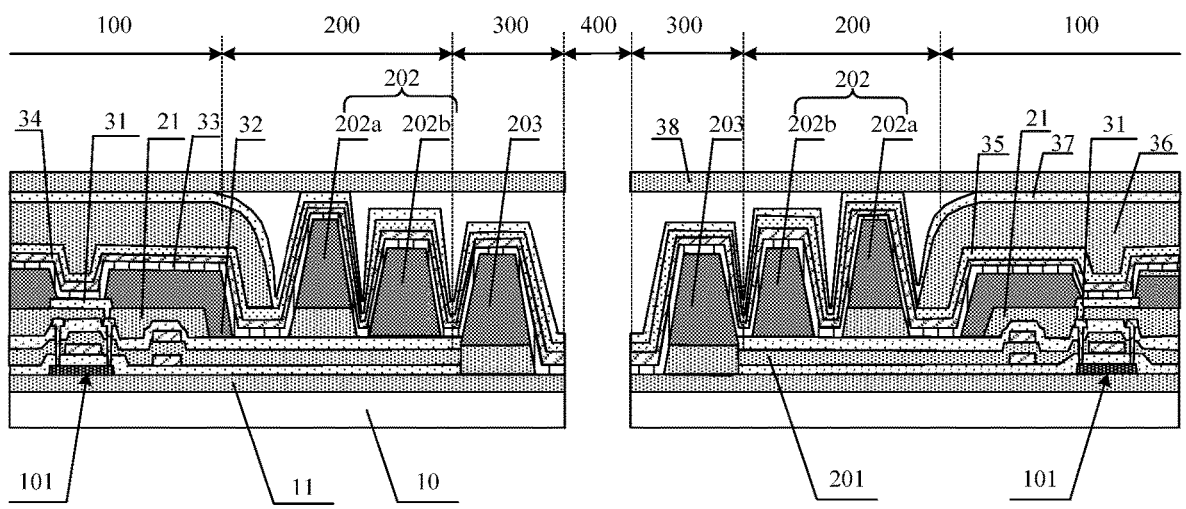
FIG. 2 is a sectional view taken along an A-A direction in FIG. 1.

FIG. 1 is a schematic diagram of a structure of a display substrate according to an embodiment of the present disclosure, and FIG. 2 is a sectional view taken along an A-A direction in FIG. 1, illustrating structures of a display region, a first transition region, a second transition region, and a vacant region in a plane perpendicular to the display substrate. As shown in FIG. 1, in a plane parallel to the display substrate, a main structure of the display substrate includes a display region 100, a first transition region 200, a second transition region 300, and a vacant region 400; the first transition region 200 is located in the display region 100, the second transition region 300 is located in the first transition region 200, and the vacant region 400 is located in the second transition region 300, that is, the first transition region 200 is an annular area surrounding the second transition region 300, and the second transition region 300 is an annular region surrounding the vacant region 400. A position of the vacant region 400 in the display region 100 is not limited, and a shape of the vacant region 400 is not limited. It may be a circle as shown in FIG. 1, or an ellipse, a square, a diamond, or other polygons.

As shown in FIG. 2, in the plane perpendicular to the display substrate, a main structure of the display region 100 includes a plurality of light-emitting units distributed in an array, each light-emitting unit includes a driving structure layer and a light-emitting structure layer disposed on a substrate 10, and the driving structure layer includes a plurality of thin film transistors. In FIG. 2, only two light-emitting units and two thin film transistors are taken as an example for illustration. Specifically, the driving structure layer mainly includes a buffer layer 11 disposed on the substrate 10 and a thin film transistor 101 disposed on the buffer layer 11. The light-emitting structure layer mainly includes an anode 31 connected to a drain electrode of the thin film transistor 101, a pixel define layer 32 defining a pixel opening region, an organic light-emitting layer 33 formed in the pixel opening region and on the pixel define layer 32, and a cathode 34 and an encapsulation layer formed on the organic light-emitting layer 33. The encapsulation layer includes a first inorganic layer 35, an organic encapsulation layer 36, and a second inorganic layer 37 that are stacked.

As shown in FIG. 2, in the plane perpendicular to the display substrate, a main structure of the first transition region 200 includes a buffer layer 11 disposed on the substrate 10, an insulating layer 201 disposed on the buffer layer 11, a plurality of dam spacers 202 disposed on the insulating layer 201, an organic light-emitting layer 33 and a cathode 34 disposed on the plurality of dam spacers 202, and a first inorganic layer 35 and a second inorganic layer 37 covering the above structure. The insulating layer 201 disposed on the substrate 10 includes a first insulating layer, a second insulating layer, and a third insulating layer formed at the same time as the driving structure layer.

In the plane perpendicular to the display substrate, a main structure of the second transition region 300 includes a buffer layer 11 disposed on the substrate 10, a plurality of post spacers 203 disposed on the buffer layer 11, an organic light-emitting layer 33 and a cathode 34 disposed on the post spacers 203, and a first inorganic layer 35 and a second inorganic layer 37 covering the above structure. Among them, a plurality of dam spacers 202 and post spacers 203 are all disposed around the vacant region 400. A plurality of dam spacers 202 are disposed between the post spacers 203 and the display region 100. An orthographic projection of the post spacers 203 on the substrate 10 does not overlap with an orthographic projection of the vacant region 400 on the substrate 10.

In an exemplary embodiment, in a plane perpendicular to the substrate 10, a width of an end of the post spacer 203 away from the substrate 10 is smaller than a width of an end of the post spacer 203 close to the substrate 10. According to the embodiment of the present disclosure, the width of the end of the post spacer 203 away from the substrate 10 is smaller than the width of the end of the post spacer 203 close to the substrate 10, so that a stacked structure near the vacant region further shrinks inward, thereby reducing heat conduction of the cutting edge.

In an exemplary embodiment, in a plane perpendicular to the substrate 10, a width of an end of the dam spacer 202 away from the substrate 10 is smaller than a width of an end of the dam spacer 202 close to the substrate 10. Exemplarily, in a plane perpendicular to the substrate 10, a cross-sectional shape of each dam spacer 202 is a regular trapezoid. When a climbing ability of the organic encapsulation layer 36 between the first inorganic layer 35 and the second inorganic layer 37 is weak, the width of the end of the dam spacer 202 away from the substrate 10 may be set to be smaller than the width of the end of the dam spacer 202 close to the substrate 10. At this time, a process is relatively simple, and it is not easy for the organic encapsulation layer 36 to pass over the dam spacer 202, which avoids encapsulation failure.

In another exemplary embodiment, in a plane perpendicular to the substrate 10, a width of an end of the dam spacer 202 away from the substrate 10 is greater than a width of an end of the dam spacer 202 close to the substrate 10. Exemplarily, in a plane perpendicular to the substrate 10, a cross-sectional shape of each dam spacer 202 is an inverted trapezoid. When a climbing ability of the organic encapsulation layer 36 between the first inorganic layer 35 and the second inorganic layer 37 is strong, the width of the end of the dam spacer 202 away from the substrate 10 may be set to be greater than the width of the end of the dam spacer 202 close to the substrate 10. At this time, the dam spacer 202 may be used to disconnect the organic light-emitting layer 33 and the cathode 34 which are subsequently evaporated in a transition region 200, and to block a water and oxygen intrusion path from the vacant region 400 to the display region 100.

In an exemplary embodiment, in a plane perpendicular to the substrate 10, a height, from the substrate 10, of an end of the dam spacer 202 away from the substrate 10 is greater than or equal to a height, from the substrate 10, of an end of the post spacer 203 away from the substrate 10.

Since a bottom of the dam spacer 202 is provided with an insulating layer 201 and a buffer layer 11, and the post spacer 203 is only formed on the buffer layer 11, the height, from the substrate 10, of an end of the dam spacer 202 away from the substrate 10 is greater than or equal to a height, from the substrate 10, of an end of the post spacer 203 away from the substrate 10. This may reduce a laser cutting thickness in a region of a mounting hole.

In an exemplary embodiment, the encapsulation layer includes a first inorganic layer 35, an organic encapsulation layer 36, and a second inorganic layer 37 that are stacked. In a plane perpendicular to the substrate 10, the height, from the substrate 10, of an end of the dam spacer 202 away from the substrate 10 is greater than a height, from the substrate 10, of an end of the first inorganic layer 35 away from the substrate 10. This may prevent the organic encapsulation layer 36 from leaking to the other side of the dam spacer 202.

In an exemplary embodiment, a plurality of dam spacers include a first dam spacer 202a and a second dam spacer 202b, the first dam spacer 202a and the second dam spacer 202b are arranged at intervals around the vacant region 400, and a closest distance between the first dam spacer 202a and the vacant region 400 is greater than a closest distance between the second dam spacer 202b and the vacant region 400.

In an exemplary embodiment, the dam spacer 202a includes a first dam foundation and a first protrusion, and the second dam spacer 202b includes a second protrusion, and the first dam foundation is disposed in the same layer as a planarization layer, and the first protrusion and the second protrusion are disposed in the same layer as a pixel define layer.

In an exemplary embodiment, the post spacer 203 includes a second dam foundation and a third protrusion, wherein the second dam foundation is disposed in the same layer as a planarization layer, and the third protrusion is disposed in the same layer as a pixel define layer.

In an exemplary embodiment, in a plane perpendicular to the substrate 10, the height, from the substrate 10, of an end of the first dam spacer 202a away from the substrate 10 is greater than or equal to a height, from the substrate 10, of an end of the second dam spacer 202b away from the substrate 10. When the height, from the substrate 10, of an end of the first dam spacer 202a away from the substrate 10 is greater than the height, from the substrate 10, of an end of the second dam spacer 202b away from the substrate 10, a height difference between the two heights may be 1-15 microns.

As shown in FIG. 2, in a plane perpendicular to the display substrate, the vacant region 400 is a through hole, and all structural film layers and substrates in the through hole are removed by laser cutting.

A structure of a display substrate according to the present disclosure is described below by an example of a preparation process of a display substrate. A "patterning process" mentioned in the present disclosure includes processes, such as film layer deposition, photoresist coating, mask exposure, development, etching, and photoresist stripping. The deposition may be any one or more selected from sputtering, evaporation, and chemical vapor deposition, the coating may be any one or more selected from spraying and spin coating, and the etching may be any one or more selected from dry etching and wet etching. A "thin film" refers to a layer of thin film manufactured by deposition or coating of a material on a substrate. If the "thin film" does not need a patterning process during a whole manufacturing process, the "thin film" may also be called a "layer". When the "thin film" needs to be subjected to a patterning process during the whole manufacturing process, a "thin film" is referred to as a "thin film" prior to the patterning process and as a "layer" subsequent to the patterning process. The "layer" subsequent to the patterning process contains at least one "pattern". In the present disclosure, "A and B are disposed on the same layer" means that A and B are formed at the same time by a same patterning process. "An orthographic projection of A contains an orthographic projection of B" means that an orthographic projection of B falls within a scope of an orthographic projection of A, or an orthographic projection of A covers an orthographic projection of B.

In some exemplary embodiments, the preparation process of the display substrate may include the following acts.

Figure 3:
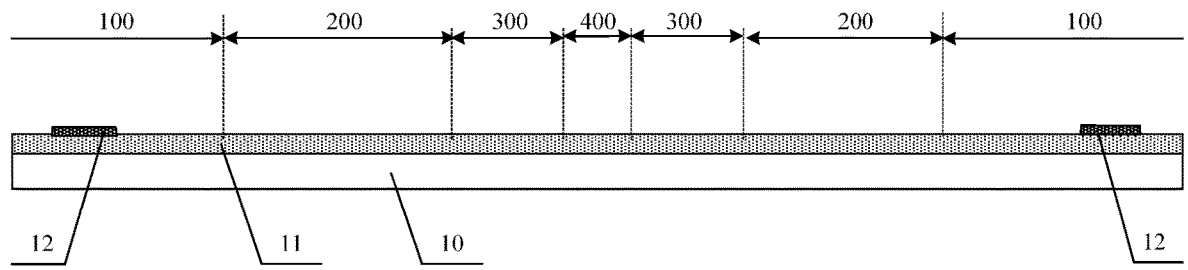
FIG. 3 is a schematic diagram of a display substrate after a pattern of an active layer is formed in an exemplary embodiment of the present disclosure.

(1) Forming a pattern of an active layer on a substrate. The forming of a pattern of an active layer on a substrate includes: a layer of buffer thin film is deposited on a substrate 10 to form a pattern of a buffer layer 11 covering the entire substrate 10. Subsequently, a layer of an active layer thin film is deposited, and the active layer thin film is patterned through a patterning process to form a pattern of the active layer 12 disposed on the buffer layer 11 in a display region 100, as shown in FIG. 3. The pattern of the active layer 12 is only formed in the display region 100, and only the buffer layer 11 is formed in a first transition region 200, a second transition region 300, and a vacant region 400 at this time. The substrate may be a flexible substrate made of a material such as polyimide (PI), polyethylene terephthalate (PET), or a surface-treated polymer soft film. The buffer thin film may be made of silicon nitride (SiNx), silicon oxide (SiOx), or the like, it may be a single layer or may be a multi-layer structure of silicon nitride/silicon oxide.

Figure 4:
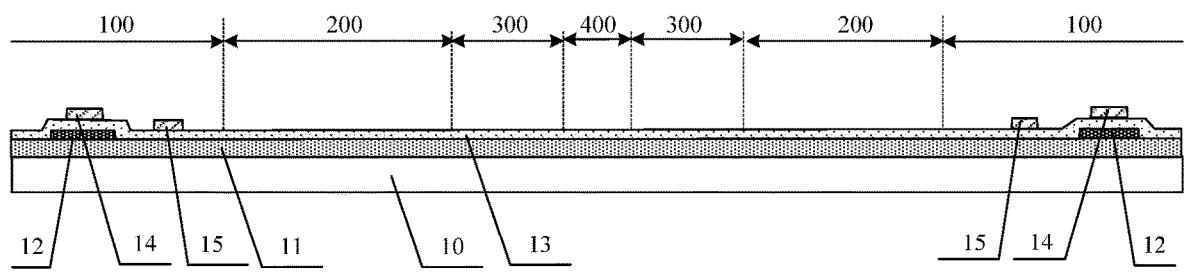
FIG. 4 is a schematic diagram of a display substrate after a pattern of a gate electrode is formed in an exemplary embodiment of the present disclosure.

(2) Forming a pattern of a gate electrode. The forming of a pattern of a gate electrode includes: a first insulating thin film and a first metal thin film are sequentially deposited on the substrate 10 on which the aforementioned structures are formed, and the first metal thin film is patterned through a patterning process to form a first insulating layer 13 covering the active layer 12 and the buffer layer 11, and patterns of a first gate electrode 14, a second gate electrode 15, and a gate line (not shown) on the first insulating layer 13, as shown in FIG. 4. The first gate electrode 14, the second gate electrode 15, and the gate line are only formed in the display region 100, and the buffer layer 11 and the first insulating layer 13 are formed in the first transition region 200, the second transition region 300, and the vacant region 400 at this time.

Figure 5:
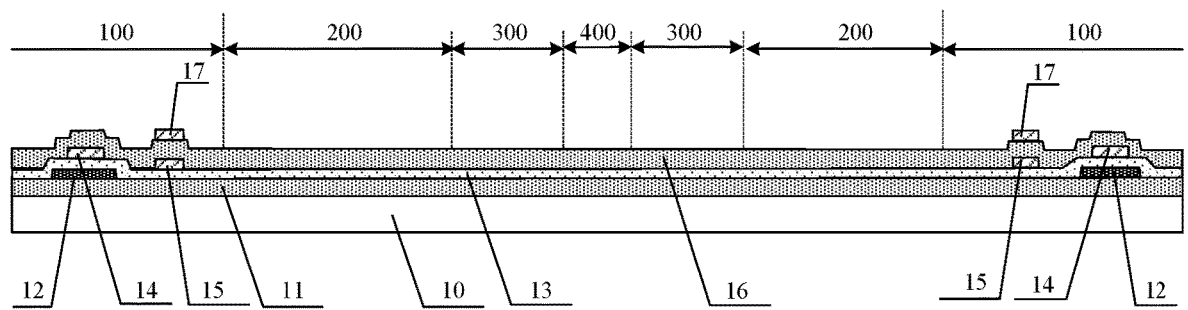
FIG. 5 is a schematic diagram of a display substrate after a pattern of a capacitor electrode is formed in an exemplary embodiment of the present disclosure.

(3) Forming a pattern of a capacitor electrode. The forming of a pattern of a capacitor electrode includes: a second insulating thin film and a second metal thin film are sequentially deposited on the substrate 10 on which the aforementioned structures are formed, and the second metal thin film is patterned through a patterning process to form a pattern of a second insulating layer 16 covering the first gate electrode 14, the second gate electrode 15, and the first insulating layer 13, and a pattern of a capacitor electrode 17 disposed on the second insulating layer 16. A position of the capacitor electrode 17 corresponds to a position of the second gate electrode 15, and the capacitor electrode 17 and the second gate electrode 15 form a capacitor, as shown in FIG. 5. The capacitor electrode 17 is only formed in the display region 100, and the buffer layer 11, the first insulating layer 13, and the second insulating layer 16 are formed in the first transition region 200, the second transition region 300, and the vacant region 400 at this time.

Figure 6:
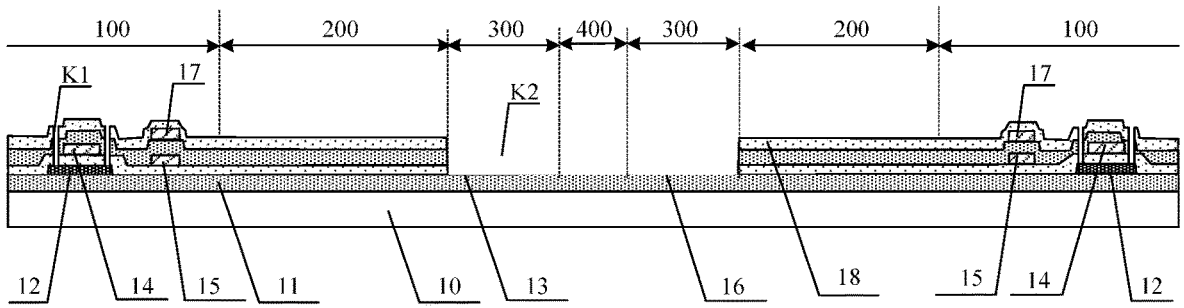
FIG. 6 is a schematic diagram of a display substrate after a pattern of a third insulating layer is formed in an exemplary embodiment of the present disclosure.

(4) Forming a pattern of a third insulating layer with vias and grooves. The forming of a pattern of a third insulating layer includes: a third insulating film is deposited on the substrate 10 on which the aforementioned structures are formed, and the third insulating film is patterned through a patterning process to form a pattern of the third insulating layer 18; the third insulating layer 18 is provided with at least two first vias K1 in the display region 100; the third insulating layer 18, the second insulating layer 16, and the first insulating layer 13 in the two first vias K1 are etched away, exposing the active layer 12; the third insulating layer 18 is also provided with a first groove K2, an orthographic projection of the first groove K2 on the substrate covers an orthographic projection of the second transition region 300 and the vacant region 400 on the substrate; the third insulating layer 18, the second insulating layer 16, and the first insulating layer 13 in the first groove K2 are etched away, exposing the buffer layer 11, as shown in FIG. 6. That is, two first vias are formed only in the display region 100, and the first groove K2 is formed in the second transition region 300 and the vacant region 400. At this time, the buffer layer 11, the first insulating layer 13, the second insulating layer 16, and the third insulating layer 18 are formed in the first transition region 200.

Figure 7:
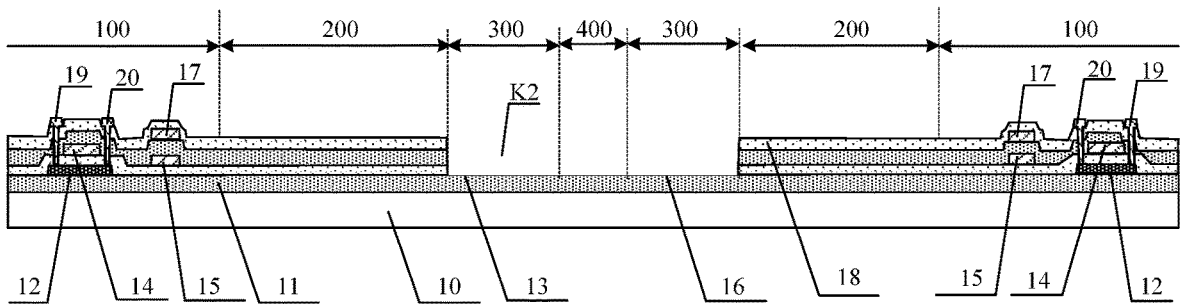
FIG. 7 is a schematic diagram of a display substrate after patterns of a source electrode and a drain electrode are formed in an exemplary embodiment of the present disclosure.

(5) Forming patterns of a source electrode and a drain electrode. The forming of patterns of a source electrode and a drain electrode includes: a third metal thin film is deposited on the substrate 10 on which the aforementioned structures are formed, and the third metal thin film is patterned through a patterning process to form patterns of a source electrode 19, a drain electrode 20, and a data line (not shown) in the display region 100. The source electrode 19 and the drain electrode 20 are connected to the active layer 12 respectively through two first vias, as shown in FIG. 7. The source electrode 19, the drain electrode 20, and the data line are only formed in the display region 100. At this time, the buffer layer 11 and the first groove K2 are formed in the second transition region 300 and the vacant region 400, and the buffer layer 11, the first insulating layer 13, the second insulating layer 16, and the third insulating layer 18 are formed in the first transition region 200.

Through the above processes, the preparation of a driving structure layer located in the display region 100, an insulating layer located in the first transition region 200, and a buffer layer located in the second transition region 300 and the vacant region 400 is completed on the substrate 10. The driving structure layer located in the display region 100 includes an active layer 12, a first gate electrode 14, a second gate electrode 15, a capacitor electrode 17, a source electrode 19, a drain electrode 20, a gate line, and a data line, and the gate line and the data line vertically intersect to define a sub-pixel, and a thin film transistor composed of the active layer 12, the first gate electrode 14, the source electrode 19 and the drain electrode 20 is disposed in the sub-pixel. The insulating layer located in the first transition region 200 includes a first insulating layer 13, a second insulating layer 16, and a third insulating layer 18. The first insulating layer and the second insulating layer are also referred to as a gate insulating layer (GI), and the third insulating layer is also referred to as an interlayer insulating layer (also referred to as Interlayer Dielectric ILD).

Figure 8:
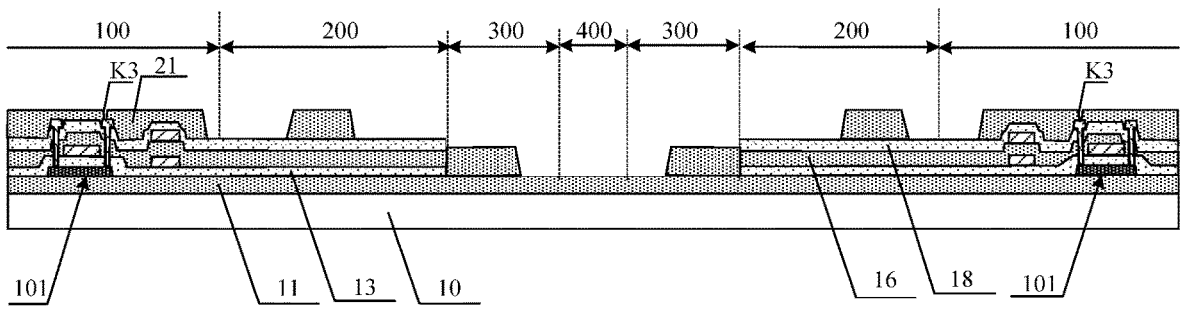
FIG. 8 is a schematic diagram of a display substrate after a pattern of a planarization layer is formed in an exemplary embodiment of the present disclosure.

(6) Forming a pattern of a planarization layer. The forming of a pattern of a planarization layer includes: a fourth insulating thin film is coated on the substrate on which the above patterns are formed, and a pattern of a fourth insulating layer 21 covering the source electrode 19 and the drain electrode 20 is formed in the display region 100 through photolithography processes of exposure and development of the mask. The fourth insulating layer 21 is provided with a second via K3 exposing the drain electrode 20, as shown in FIG. 8. The fourth insulating layer 21 is formed in the display region 100, the first transition region 200, and the second transition region 300; an orthographic projection of the fourth insulating layer 21 in the first transition region 200 overlaps with an orthographic projection of a subsequent formed first dam spacer 202*a* on the substrate, that is, the fourth insulating layer 21 formed in the first transition region 200 serves as a dam foundation of the subsequent formed first dam spacer 202*a*; an orthographic projection of the fourth insulating layer 21 in the second transition region 300 overlaps with an orthographic projection of a subsequent formed post spacer 203 on the substrate, that is, the fourth insulating layer 21 formed in the second transition region 300 serves as a dam foundation of the subsequent formed post spacer 203; and the fourth insulating thin film in other places is developed, and the buffer layer 11 is formed in the vacant region 400 at this time. The fourth insulating layer is also called a planarization layer (PLN).

Figure 9:
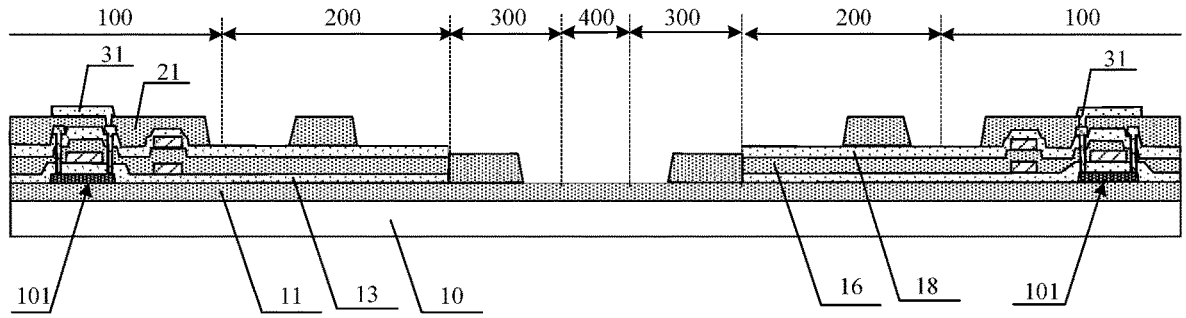
FIG. 9 is a schematic diagram of a display substrate after a pattern of an anode is formed in an exemplary embodiment of the present disclosure.

(7) Forming a pattern of an anode. The forming of a pattern of an anode includes: a transparent conductive thin film is deposited on the substrate on which the above patterns are formed, and is patterned through a patterning process to form a pattern of an anode 31 in the display region 100. The anode 31 is connected to the drain electrode 20 through the second via, as shown in FIG. 9. The anode 31 is only formed in the display region 100, and transparent conductive thin films of the first transition region 200, the second transition region 300, and the vacant region 400 are etched away. At this time, the buffer layer 11, the first insulating layer 13, the second insulating layer 16, the third insulating layer 18, and the fourth insulating layer 21 disposed on the third insulating layer 18 are formed in the first transition region 200; the buffer layer 11 and the fourth insulating layer 21 disposed on the buffer layer 11 are formed in the second transition region 300, and the buffer layer 11 is formed in the vacant region 400. The transparent conductive thin film may be made of indium tin oxide (ITO) or indium zinc oxide (IZO).

Figure 10:
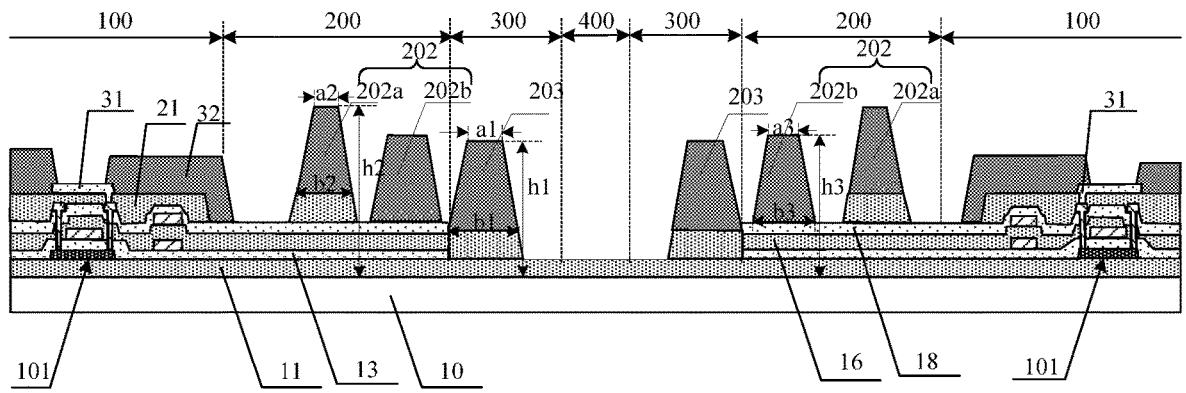
FIG. 10 is a schematic diagram of a display substrate after a pattern of a pixel define layer is formed in an exemplary embodiment of the present disclosure.

(8) Forming a pattern of a pixel define layer. The forming of a pattern of a pixel define layer includes: a pixel define thin film is coated on the substrate on which the above patterns are formed, and a pattern of the pixel define layer 32 is formed through a photolithography process; the pattern of the pixel define layer 32 may be located in the display region 100, the first transition region 200, and the second transition region 300; the pattern of the pixel define layer 32 of the display region 100 defines a pixel opening region exposing the anode 31 in each sub-pixel; a part of the pattern of the pixel define layer 32 of the first transition region 200 is disposed on the fourth insulating layer 21 to form a convex part of the first dam spacer 202*a*, and the other part is disposed on the third insulating layer 18 to form a convex part of the second dam spacer 202*b*; the pattern of the pixel define layer 32 of the second transition region 300 is disposed on the fourth insulating layer 21 to form a convex part of the post spacer 203, as shown in FIG. 10. At this time, the buffer layer 11 is formed in the vacant region 400. Herein, the pixel define layer may be made of polyimide, acrylic, polyethylene terephthalate, or the like.

In an exemplary embodiment, as shown in FIG. 10, in the second transition region 300, the post spacers 203 are disposed at intervals around the vacant region 400, and the dam spacers 202 are disposed between the post spacers 203 and the display region 100. In this embodiment, the dam spacer 202 is formed in the first transition region 200, and the post spacer 203 is formed in the second transition region 300. In this embodiment, a plurality of dam spacers 202 and a plurality of post spacers 203 are used to block water and oxygen intrusion and crack propagation paths from the vacant region 400 to the display region 100.

In an exemplary embodiment, as shown in FIG. 10, in a plane perpendicular to the substrate 10, a cross-sectional shape of each post spacer 203 has characteristics of being narrow at a top and wide at a bottom, that is, a width a1 of an end (upper end) of the post spacer 203 away from the substrate 10 is smaller than a width b1 of an end (lower end) of the post spacer 203 close to the substrate 10. Exemplarily, in a plane perpendicular to the substrate 10, a cross-sectional shape of each post spacer 203 may be a regular trapezoid.

In an exemplary embodiment, as shown in FIG. 10, in a plane perpendicular to the substrate 10, a closest distance between an end (upper end) of the post spacer 203 away from the substrate 10 and the vacant region 400 is between 2 to 6 times a closest distance between an end (lower end) of the post spacer 203 close to the substrate 10 and the vacant region 400. For example, the closest distance between the end (upper end) of the post spacer 203 away from the substrate 10 and the vacant region 400 may be 10 to 20 microns, so as to prevent thermal expansion of the encapsulation layer from failing when the vacant region 400 is laser cut. The closest distance between the end (lower end) of the post spacer 203 close to the substrate 10 and the vacant region 400 may be 1 to 5 microns, so as to prevent the transition region 200 from being too wide to affect adversely a display effect.

In an exemplary embodiment, as shown in FIG. 10, in a plane perpendicular to the substrate 10, a cross-sectional shape of each dam spacer 202 has characteristics of being narrow at a top and wide at a bottom, that is, a width a2 or a3 of an end (upper end) of the dam spacer 202 away from the substrate 10 is smaller than a width b2 or b3 of an end (lower end) of the dam spacer 202 close to the substrate 10. Exemplarily, in a plane perpendicular to the substrate 10, a cross-sectional shape of each post spacer 203 may be a regular trapezoid.

In another exemplary embodiment, in a plane perpendicular to the substrate 10, a cross-sectional shape of each dam spacer 202 has characteristics of being wide at a top and narrow at a bottom, that is, a width a2 or a3 of an end (upper end) of the dam spacer 202 away from the substrate 10 is greater than a width b2 or b3 of an end (lower end) of the dam spacer 202 close to the substrate 10. Exemplarily, in a plane perpendicular to the substrate 10, a cross-sectional shape of each post spacer 203 may be an inverted trapezoid.

In an exemplary embodiment, in a plane perpendicular to the substrate 10, a height h2 or h3, from the substrate 10, of an end of the dam spacer 202 away from the substrate 10 is greater than or equal to a height h1, from the substrate 10, of an end of the post spacer 203 away from the substrate 10.

In an exemplary embodiment, in a plane parallel to the substrate 10, a cross-sectional shape of each post spacer 203 may be rectangular, circular, elliptical, or the like.

In an exemplary embodiment, the plurality of dam spacers 202 include a plurality of first dam spacers 202*a* and a plurality of second dam spacers 202*b*, the plurality of first dam spacers 202*a* and the plurality of second dam spacers 202*b* are respectively disposed around the post spacers 203, and a closest distance between a first dam spacer 202*a* and a post spacer 203 is greater than a closest distance between a second dam spacer 202*b* and a post spacer 203.

Figure 11:
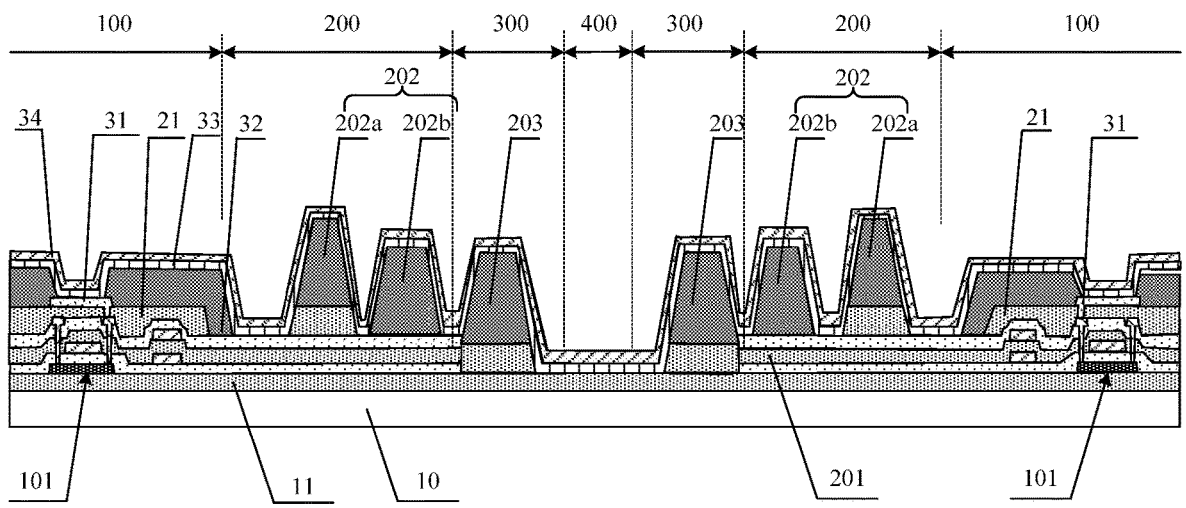
FIG. 11 is a schematic diagram of a display substrate after patterns of an organic light-emitting layer and a cathode are formed in an embodiment of the present disclosure.

In an exemplary embodiment, as shown in FIG. 11, in a plane perpendicular to the substrate 10, a distance between an end (lower end) of a second dam spacer 202*b* close to the substrate 10 and an end (lower end) of a post spacer 203 close to the substrate 10 may be 5 to 40 microns.

In an exemplary embodiment, as shown in FIG. 11, in a plane perpendicular to the substrate 10, a distance between an end (lower end) of a first dam spacer 202*a* close to the substrate 10 and an end (lower end) of a second dam spacer 202*b* close to the substrate 10 may be 10 to 40 microns to prevent poor display caused by the organic encapsulation layer 36 climbing over a first dam spacer 202*a*.

In an exemplary embodiment, a dam spacer 202 and a post spacer 203 may be formed on the same layer or on different layers. The embodiment of the present disclosure does not limit materials of the dam spacer 202 and the post spacer 203, and does not limit which layer of the display substrate forms the dam spacer 202 and the post spacer 203.

In an exemplary embodiment, a dam spacer 202 may be formed by any one or more of a planarization layer, a pixel define layer, or a supporting pillar layer (not shown), and a post spacer 203 may also be formed by any one or more of a planarization layer, a pixel define layer, or a supporting pillar layer. The supporting pillar layer of the display region 100 is used to maintain a distance between the display substrate and a cover plate (not shown) to avoid scratching an OLED film layer or generating a Newton ring.

In an exemplary embodiment, the display substrate further includes at least one anti-crack dam (Crack Dam) (not shown) for preventing the insulating layer 201 of the first transition region 200 from being cracked by laser cutting a mounting hole and thereby damaging a driving structure layer structure of the display region 100. The crack dam may be formed between a post spacer 203 and a dam spacer 202*b*, and the crack dam may include any one or more of the following: a first crack dam prepared in a same layer as a source-drain electrode layer, a second crack dam prepared in a same layer as a first gate electrode layer, and a third crack dam prepared in a same layer as a second gate electrode layer. In this embodiment, since a dam foundation of the post spacer 203 is disposed on the buffer layer 11, a step of preparing a crack dam may be omitted. When the mounting hole is laser cut, the post spacer 203 may simultaneously protect structures of the driving structure layer and a light-emitting layer of the display region 100.

(9) Forming patterns of an organic light-emitting layer and a cathode. The forming of patterns of an organic light-emitting layer and a cathode includes: an organic light-emitting material and a cathode metal thin film are sequentially evaporated on the substrate on which the aforementioned patterns are formed to form patterns of an organic light-emitting layer 33 and a cathode 34. In the display region 100, the organic light-emitting layer 33 is connected to the anode 31 in the pixel opening region defined by the pixel define layer 32, and the cathode 34 is disposed on the organic light-emitting layer 33. In the transition region 200, the organic light-emitting layer 33 and the cathode 34 are formed on the supporting pillar layer. In the first transition region 200, the organic light-emitting layer 33 and the cathode 34 are formed on the dam spacer 202, and in the second transition region 300, the organic light-emitting layer 33 and the cathode 34 are formed on the post spacer 203. In the vacant region 400, the organic light-emitting layer 33 and the cathode 34 are formed on the buffer layer 11, as shown in FIG. 11. The organic light-emitting layer 33 mainly includes a light-emitting layer (EML). In an actual implementation, an organic light-emitting layer 33 may include a hole injection layer, a hole transport layer, a light-emitting layer, an electron transport layer, and an electron injection layer disposed sequentially to improve an efficiency of injecting electrons and holes into the light-emitting layer. A cathode may be made of one of metal materials such as magnesium (Mg), argentum (Ag), aluminum (Al), copper (Cu), lithium (Li), or an alloy made of one or more of the above metals.

Figure 12:
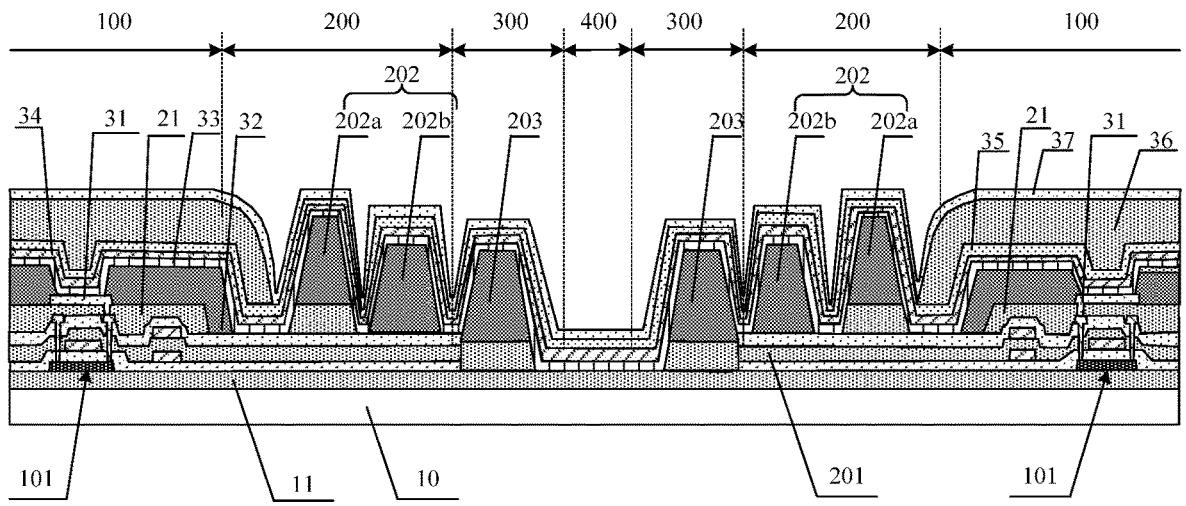
FIG. 12 is a schematic diagram of a display substrate after a pattern of an encapsulation layer is formed in an exemplary embodiment of the present disclosure.

(10) Forming a pattern of an encapsulation layer. The forming of a pattern of an encapsulation layer includes: a first inorganic thin film is deposited on the substrate on which the aforementioned patterns are formed; the first inorganic thin film covers the display region 100, the first transition region 200, the second transition region 300, and the vacant region 400 to form a pattern of a first inorganic layer 35. Next, an organic encapsulation layer 36 is formed on the display region 100 by inkjet printing. Subsequently, a second inorganic thin film is deposited, and the second inorganic thin film covers the display region 100, the first transition region 200, the second transition region 300, and the vacant region 400 to form a pattern of a second inorganic layer 37, as shown in FIG. 12. Among them, the encapsulation layer has a three-layer structure of inorganic/organic/inorganic. An organic layer in the middle is only formed in the display region 100. Upper and lower inorganic layers cover the display region 100, the first transition region 200, the second transition area 300, and the vacant region 400 to complete encapsulation of the display substrate.

Through the above processes, the preparation of the light-emitting structure layer located in the display region 100, the dam spacer 202 located in the first transition region 200, and the post spacer 203 located in the second transition region 300 is completed. Among them, the light-emitting structure layer located in the display region 100 includes the anode 31, the pixel definition layer 32, the organic light-emitting layer 33, the cathode 34, and the encapsulation layer.

(11) Lastly, module stage process is performed. After a polarizer 38 is attached, various structural film layers and substrate of the vacant region 400 are etched away by a laser and other related processes to form an OLED display substrate with a mounting hole in the embodiment of the present disclosure, as shown in FIG. 2. In an actual implementation, various structural film layers and substrate of the vacant region 400 may be all etched away to form a through hole, or part of structural film layers of the vacant region 400 may be etched away to form a blind hole, which is determined according to actual needs, and the embodiment of the present disclosure are not particularly limited here.

It can be seen from the structure and preparation process of the display substrate in the present disclosure that, without changing existing processes, by providing a plurality of post spacers 203 around the vacant region 400 at intervals, the stacked structure of the vacant region 400 shrinks inward before cutting, thereby avoiding an interlayer splitting phenomenon caused by thermal expansion of film layers caused by heat conduction of a cutting edge, and solving a problem of cracking of an edge structure caused by adhesion stress in the subsequent film peeling process. On the other hand, the contact area between the inorganic encapsulation layer and the polarizer is increased (as shown in FIG. 2, although there are gaps between the polarizer 38 and the second dam spacer 202b and between the polarizer 38 and the dam spacer 203, since the polarizer 38 and the display substrate are attached by roller bonding, the polarizer 38 and the second dam spacer 202b can actually be fully attached and the polarizer 38 and the post spacer 203 can actually be fully attached), the angle formed by edge cutting of the AA hole is reduced, and the stress concentration of the cutting edge of the AA hole is reduced, thereby avoiding the GDS problem caused by the cracking of the edge structure caused by adhesion stress in the subsequent film peeling process.

At the same time, since the preparation process of the embodiments of the present disclosure may be achieved by using existing mature manufacturing devices without changing the existing processes, the process is simple to realize, easy to implement, and has a high production efficiency, and has advantages of easy process realization, a low production cost, and a high yield, and has good application prospects.

The description of the structure and preparation process of the display substrate according to the present disclosure is merely illustrative. In an actual implementation, corresponding structures may be changed and patterning processes may be added or reduced according to actual needs. For example, an OLED display substrate may be not only a top emission structure, but alternatively a bottom emission structure. For another example, a thin film transistor may be not only a top gate structure, but alternatively a bottom gate structure, or may be not only a dual gate structure, but alternatively a single gate structure. For another example, a thin film transistor may be an amorphous silicon (a-Si) thin film transistor, a low-temperature polysilicon (LTPS) thin film transistor or an oxide thin film transistor, and a driving structure layer and a light emitting structure layer may also be disposed with other electrodes, leads, and structure film layers, which is not limited herein.

Figure 13:
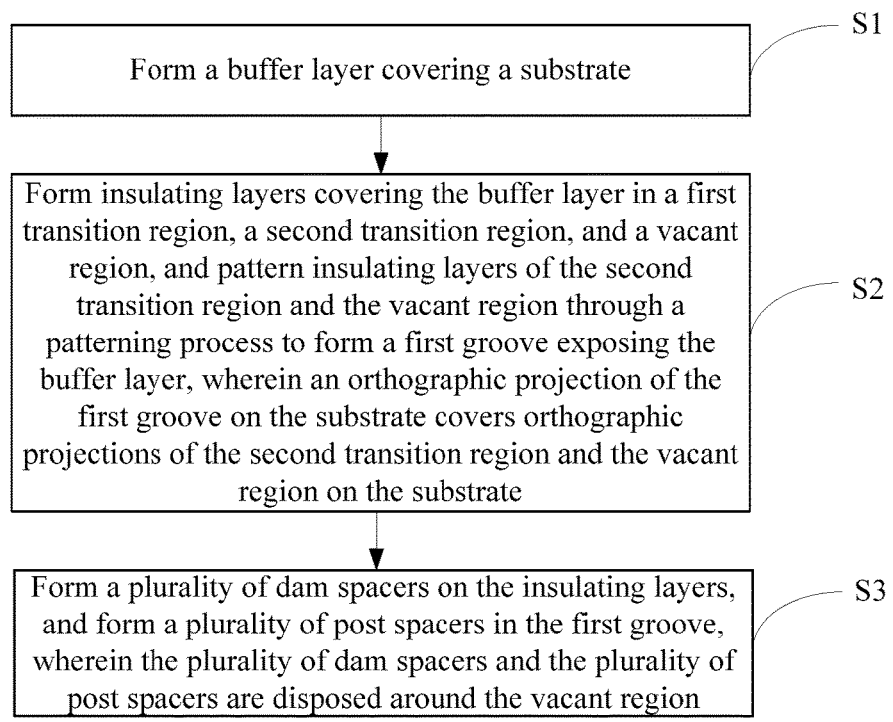
FIG. 13 is a schematic flowchart of a preparation method of a display substrate in an exemplary embodiment of the present disclosure.

The present disclosure further provides a preparation method of a display substrate. The display substrate includes a display region, a first transition region located in the display region, a second transition region located in the first transition region, and a vacant region located in the second transition region. As shown in FIG. 13, the preparation method of the display substrate provided by the present disclosure includes: S1, forming a buffer layer covering a substrate; S2, forming an insulating layer, covering the buffer layer, in the first transition region, the second transition region, and the vacant region, and patterning the insulating layer of the second transition region and the vacant region through a patterning process to form a first groove exposing the buffer layer, an orthographic projection of the first groove on the substrate covers orthographic projections of the second transition region and the vacant region on the substrate; and S3, forming a plurality of dam spacers on the insulating layer, and forming a plurality of post spacers in the first groove, and the plurality of dam spacers and the plurality of post spacers are disposed around the vacant region.

In an exemplary embodiment, a dam spacer and a post spacer are disposed on the same layer, made of the same material and formed by the same process; or, a dam spacer and a post spacer are not disposed in the same layer.

In an exemplary embodiment, the preparation method further includes: forming a driving structure layer disposed on the substrate, a planarization layer disposed on the driving structure layer, and a pixel define layer defining a pixel opening region in the display region; the driving structure layer includes a buffer layer located on a flexible substrate, an active layer located on the buffer layer, a first insulating layer covering the active layer, a first gate electrode layer located on the first insulating layer, a second insulating layer covering the first gate electrode layer, a second gate electrode layer located on the second insulating layer, a third insulating layer covering the second gate electrode layer, and a first source-drain electrode layer located on the third insulating layer; an insulating layer includes a first insulating layer located on the buffer layer, a second insulating layer located on the first insulating layer, and a third insulating layer located on the second insulating layer.

In an exemplary embodiment, a plurality of dam spacers include a plurality of first dam spacers and a plurality of second dam spacers; a first dam spacer includes a first dam foundation and a first protrusion, and a second dam spacer includes a second protrusion; a closest distance between a first dam spacer and a vacant region is greater than a closest distance between a second dam spacer and the vacant region; the first dam foundation is disposed in the same layer as a planarization layer, and the first protrusion and the second protrusion are disposed in the same layer as a pixel define layer.

In an exemplary embodiment, a post spacer includes a second dam foundation and a third protrusion, the second dam foundation is disposed in the same layer as a planarization layer, and the third protrusion is disposed in the same layer as a pixel define layer.

In an exemplary embodiment, the preparation method further includes forming a supporting pillar layer on a pixel define layer; a dam spacer may be prepared in the same layer as any one or more of a planarization layer, the pixel define layer, and the supporting pillar layer, and a post spacer may be prepared in the same layer as any one or more of the planarization layer, the pixel define layer, and the supporting pillar layer.

According to the preparation method of the display substrate provided by the present disclosure, by providing a plurality of post spacers around a vacant region at intervals, a stacked structure of the vacant region shrinks inward before cutting, thereby avoiding an interlayer splitting phenomenon caused by thermal expansion of film layers under heat conduction of a cutting edge, and solving a problem of cracking of an edge structure caused by adhesion stress in a subsequent film peeling process. On the other hand, a contact area between an inorganic encapsulation layer and a polarizer is increased, an angle formed by edge cutting of an AA hole is reduced, and stress concentration of a cutting edge of the AA hole is reduced, thereby avoiding a GDS problem caused by the cracking of the edge structure caused by adhesion stress in the subsequent film peeling process. The preparation process according to the present disclosure may be realized by using existing mature preparation devices without changing existing preparation processes, and the process is simple to realize, easy to implement, and has a high production efficiency, a low production cost, and a high yield.

The present disclosure further provides a display apparatus including the display substrate in the aforementioned embodiments. The vacant region in the aforementioned embodiments is used to install a hardware structure. Illustratively, the hardware structure includes structures such as a camera. The display apparatus may be any product or component with a display function, such as a mobile phone, a tablet computer, a television, a display, a laptop computer, a digital photo frame, and a navigator.

The drawings in the present disclosure only refer to the structures involved in the present disclosure, and common designs may be referred to for other structures. The embodiments of the present disclosure, i.e., features in the embodiments may be combined with each other to obtain new embodiments if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:
    a display region, a first transition region located in the display region, a second transition region located in the first transition region, and a vacant region located in the second transition region, wherein
    the first transition region comprises a substrate, a buffer layer disposed on the substrate, an insulating layer disposed on the buffer layer, and a plurality of dam spacers disposed on the insulating layer;
    the second transition region comprises a substrate, a buffer layer disposed on the substrate, and a plurality of post spacers disposed on the buffer layer; and
    the plurality of dam spacers and the plurality of post spacers are all disposed around the vacant region,
    wherein the display region comprises a substrate, a driving structure layer disposed on the substrate, a planarization layer disposed on the driving structure layer, and a pixel define layer defining a pixel opening region;
    wherein the driving structure layer comprises a buffer layer located on the substrate, an active layer located on the buffer layer, a first insulating layer covering the active layer, a first gate electrode layer located on the first insulating layer, a second insulating layer covering the first gate electrode layer, a second gate electrode layer located on the second insulating layer, a third insulating layer covering the second gate electrode layer, and a first source-drain electrode layer located on the third insulating layer; and
    the insulating layer comprises a first insulating layer located on the buffer layer, a second insulating layer located on the first insulating layer, and a third insulating layer located on the second insulating layer,
    wherein each post spacer comprises a second dam foundation and a third protrusion, wherein
    the second dam foundation and the planarization layer are disposed in a same layer, and the third protrusion and the pixel define layer are disposed in a same layer.

2. The display substrate of claim 1, wherein the plurality of dam spacers comprise a plurality of first dam spacers and a plurality of second dam spacers; each first dam spacer comprises a first dam foundation and a first protrusion, and each second dam spacer comprises a second protrusion; a closest distance between the first dam spacer and the vacant region is greater than a closest distance between the second dam spacer and the vacant region, wherein
    the first dam foundation is disposed in a same layer as the planarization layer, and the first protrusion and the second protrusion are disposed in a same layer as the pixel define layer.

3. The display substrate of claim 2, wherein in a direction perpendicular to the substrate, a height, from the substrate, of an end of the first dam spacer away from the substrate is greater than or equal to a height, from the substrate, of an end of the second dam spacer away from the substrate.

4. The display substrate of claim 2, wherein in a direction perpendicular to the substrate, a distance between an end of the second dam spacer close to the substrate and an end of a post spacer close to the substrate is 5 to 40 microns, and a distance between an end of the first dam spacer close to the substrate and the end of the second dam spacer close to the substrate is 10 to 40 microns.

5. The display substrate of claim 1, wherein in a direction perpendicular to the substrate, a height, from the substrate, of an end of a dam spacer away from the substrate is greater than or equal to a height, from the substrate, of an end of the post spacer away from the substrate.

6. The display substrate of claim 1, wherein in a direction perpendicular to the substrate, a width of an end of a post spacer away from the substrate is smaller than a width of an end of the post spacer close to the substrate.

7. The display substrate of claim 6, wherein a closest distance between the end of the post spacer away from the substrate and the vacant region is 10 to 20 microns; and a closest distance between the end of the post spacer close to the substrate and the vacant region is 1 to 5 microns.

8. The display substrate of claim 1, wherein in a direction perpendicular to the substrate, a width of an end of a dam spacer away from the substrate is smaller than a width of an end of the dam spacer close to the substrate.

9. The display substrate of claim 1, wherein the display region further comprises a light-emitting structure layer disposed on the planarization layer and an encapsulation layer disposed on the light-emitting structure layer, wherein the encapsulation layer comprises a first inorganic layer, a second inorganic layer, and an organic encapsulation layer disposed between the first inorganic layer and the second inorganic layer, and both the first inorganic layer and the second inorganic layer extend to the first transition region and the second transition region, and cover the plurality of dam spacers and the plurality of post spacers.

10. The display substrate of claim 9, further comprising a polarizer located on the encapsulation layer, an orthographic projection of a contact region between the second inorganic layer and the polarizer in the second transition region on the substrate is within a range of an orthographic projection of a post spacer on the substrate; in a direction parallel to the substrate, an area of the contact region between the second inorganic layer and the polarizer in the second transition region is greater than or equal to an area of an end of the post spacer away from the substrate.

11. A display apparatus, comprising the display substrate of claim 1, wherein the vacant region is configured to install a hardware structure.

12. A preparation method for a display substrate, wherein the display substrate comprises a display region, a first transition region located in the display region, a second transition region located in the first transition region, and a vacant region located in the second transition region, the preparation method comprising:
forming a buffer layer covering a substrate;
forming insulating layers covering the buffer layer in the first transition region, the second transition region, and the vacant region, and patterning the insulating layer of the second transition region and the insulating layer of the vacant region through a patterning process to form a first groove exposing the buffer layer, wherein an orthographic projection of the first groove on the substrate covers orthographic projections of the second transition region and the vacant region on the substrate; and
forming a plurality of dam spacers on the insulating layers, and forming a plurality of post spacers in the first groove, wherein the plurality of dam spacers and the plurality of post spacers are disposed around the vacant region,
forming a driving structure layer disposed on the substrate, a planarization layer disposed on the driving structure layer, and a pixel define layer defining a pixel opening region in the display region;
wherein the driving structure layer comprises a buffer layer located on the substrate, an active layer located on the buffer layer, a first insulating layer covering the active layer, a first gate electrode layer located on the first insulating layer, a second insulating layer covering the first gate electrode layer, a second gate electrode layer located on the second insulating layer, a third insulating layer covering the second gate electrode layer, and a first source-drain electrode layer located on the third insulating layer; and
the insulating layers comprises a first insulating layer located on the buffer layer, a second insulating layer located on the first insulating layer, and a third insulating layer located on the second insulating layer,
wherein each post spacer comprises a second dam foundation and a third protrusion, wherein
the second dam foundation and the planarization layer are disposed in a same layer, and the third protrusion and the pixel define layer are disposed in a same layer.

13. The preparation method of claim 12, wherein the dam spacers and the post spacers are disposed on a same layer, made of a same material, and formed by a same process; or, the dam spacers and the post spacers are not disposed in a same layer.

14. The preparation method of claim 12, wherein the plurality of dam spacers comprise a plurality of first dam spacers and a plurality of second dam spacers; each first dam spacer comprises a first dam foundation and a first protrusion, and each second dam spacer comprises a second protrusion; a closest distance between the first dam spacer and the vacant region is greater than a closest distance between the second dam spacer and the vacant region; and
the first dam foundation is disposed in a same layer as the planarization layer, and the first protrusion and the second protrusion are disposed in a same layer as the pixel define layer.

* * * * *